United States Patent
Song et al.

(10) Patent No.: US 9,857,425 B2
(45) Date of Patent: Jan. 2, 2018

(54) TEST CIRCUIT BOARD ADAPTED TO BE USED ON MEMORY SLOT

(71) Applicants: Inventec (Pudong) Technology Corporation, Shanghai (CN); Inventec Corporation, Taipei (TW)

(72) Inventors: Ping Song, Shanghai (CN); Chang Qing Mu, Shanghai (CN); Xiao Qian Li, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/073,559

(22) Filed: Mar. 17, 2016

(65) Prior Publication Data

US 2017/0184668 A1     Jun. 29, 2017

(30) Foreign Application Priority Data

Dec. 24, 2015    (CN) .......................... 2015 1 0991292

(51) Int. Cl.
G06F 11/00    (2006.01)
G01R 31/3177    (2006.01)
G06F 11/22    (2006.01)

(52) U.S. Cl.
CPC .......... *G01R 31/3177* (2013.01); *G06F 11/22* (2013.01)

(58) Field of Classification Search
CPC .... G01R 31/318533; G01R 31/318536; G01R 31/318597

USPC .............................................. 714/30, 42, 43
See application file for complete search history.

(56) References Cited

U.S. PATENT DOCUMENTS

| | | | |
|---|---|---|---|
| 7,305,595 B2 * | 12/2007 | Goodwin | G01R 31/318533 714/30 |
| 7,730,369 B2 * | 6/2010 | Cases | G06F 11/24 714/718 |
| 2007/0226795 A1 * | 9/2007 | Conti | G06F 21/74 726/22 |
| 2009/0006915 A1 * | 1/2009 | Gomez | G06F 11/2236 714/727 |
| 2009/0113264 A1 * | 4/2009 | Seibold | G01R 31/318544 714/727 |
| 2012/0131403 A1 * | 5/2012 | Chin | G01R 31/31853 714/727 |
| 2015/0067422 A1 * | 3/2015 | Hamilton | G06F 11/24 714/724 |
| 2016/0077151 A1 * | 3/2016 | Anand | G01B 31/318588 702/122 |

* cited by examiner

*Primary Examiner* — Elmira Mehrmanesh
(74) *Attorney, Agent, or Firm* — David R. Stevens; Stevens Law Group

(57) ABSTRACT

A test circuit board adapted to be used on memory slot is provided. Each memory slot of a board to be tested is connected to one test circuit board. A plurality of the test circuit boards form an in-series connection therebetween. A test access port (TAP) controller is connected electrically to the board to be tested and one of the test circuit boards so that the memory slots, which are connected to the test circuit boards, may be tested at the same time.

4 Claims, 2 Drawing Sheets

TEST CIRCUIT BOARD ADAPTED TO BE USED ON MEMORY SLOT

CROSS-REFERENCE TO RELATED APPLICATION

This application claims the benefit of Chinese Patent Application No. 201510991292.4, filed Dec. 24, 2015.

BACKGROUND OF THE RELATED ART

Technical Field

The present invention relates to a circuit board, and particularly to a circuit board adapted to be used on memory slot where a first joint test activity group (JTAG) connection interface and a second JTAG connection interface are provided to form an in-series connection between test circuit boards.

Related Art

For the currently available the test technologies regarding a memory slot in a board to be tested, only a single test circuit board is tested in most cases, and only a single memory slot may be tested. In this case, the issue of absence of a test signal coverage is generally arisen, lending to an unfavorable effect on the test in a production process.

In view of the above, it may be known that there has long been existed in the prior art of the absence of the test signal coverage on the memory slot in the board to be tested. Therefore, there is quite a need to set forth an improvement means to settle down this problem.

SUMMARY

In view of the issues of absence of the test signal overage of the memory slot in the board to be tested in the prior art, the present invention provides a test circuit board suitable to be used on memory slot.

According to the present invention, the test circuit board adapted to be used on memory slot comprises the test circuit board, further comprising a memory connection interface, forming an electrical connection being inserted into a memory slot; a first joint test action group (JTAG) connection interface, connected electrically to a test access port (TAP) controller or connected electrically to a second JTAG connection interface of another test circuit board to form an in-series connection with the another test circuit board; a second JTAG connection interface, connected electrically to the first JTAG connection interface of the another test circuit board; a JTAG signal processing chip, connected electrically to the first and second JTAG respectively, to increase a stability of a JTAG signal of the first and second JTAGs respectively; at least a JTAG control chip, connected electrically to the JTAG processing chip, to detect a plurality of pins of the memory slot, control a state of the memory slot and simulate an Inter-Integrated Circuit (IIC) of the memory slot; at least an analog-to-digital converter (ADC) chip, connected electrically to the JTAG control chip, to be used to detect a voltage of the plurality of pins of the memory slot; a switch chip, connected electrically to the JTAG control chip and the ADC chip, to be used to detect a particular signal of the plurality of pins of the memory slot through the JTAG control chip or the ADC chip; and a voltage conversion chip, providing a work voltage required by the JTAG signal processing chip, the JTAG control chip, the ADC chip and the switch chip respectively, through the memory slot by acquiring a power supply.

The test circuit board of the present invention has the difference as compared to the prior art that the first and second JTAG connection interfaces of the test circuit board may form the in-series connection therebetween to reduce a required number of TAP ports in the TAP controller, and the test circuit board provides a test signal coverage on all the test signals, facilitate a use of a production line, to further reduce a cost of the test circuit board.

By using the above technical means, the present invention may achieve in the technical efficacies of a reduced required TAP number in the TAP controller and a test signal coverage on all the test signals.

BRIEF DESCRIPTION OF THE DRAWINGS

The present invention will be better understood from the following detailed descriptions of the preferred embodiments according to the present invention, taken in conjunction with the accompanying drawings, in which.

DETAILED DESCRIPTION

The present invention will be apparent from the following detailed description, The present invention will be apparent from the following detailed description, which proceeds with reference to the accompanying drawings, wherein the same references relate to the same elements.

Figure 1:
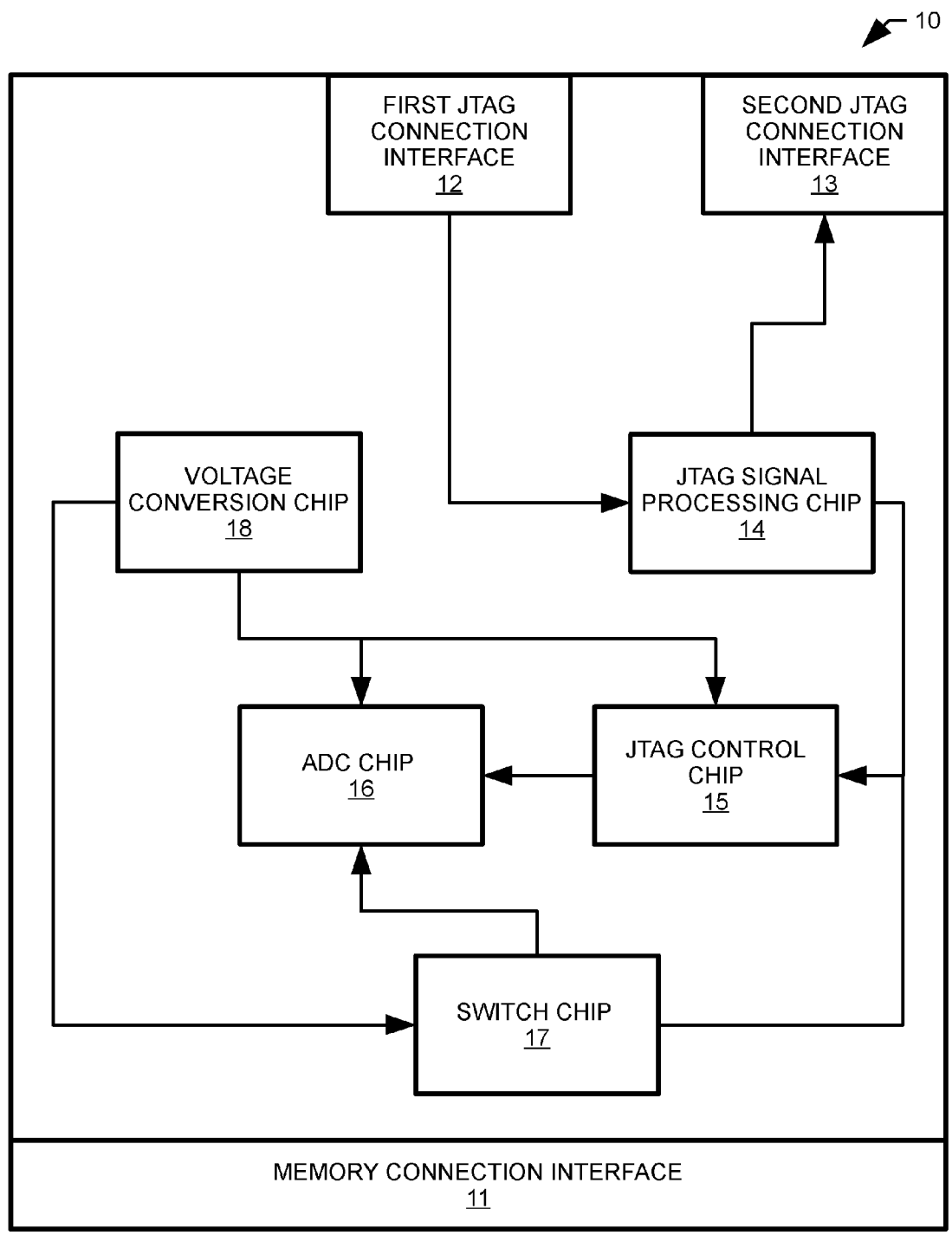
FIG. 1 is a schematic diagram of an architecture of a test circuit board adapted to be used on memory slot according to the present invention.
Figure 2:
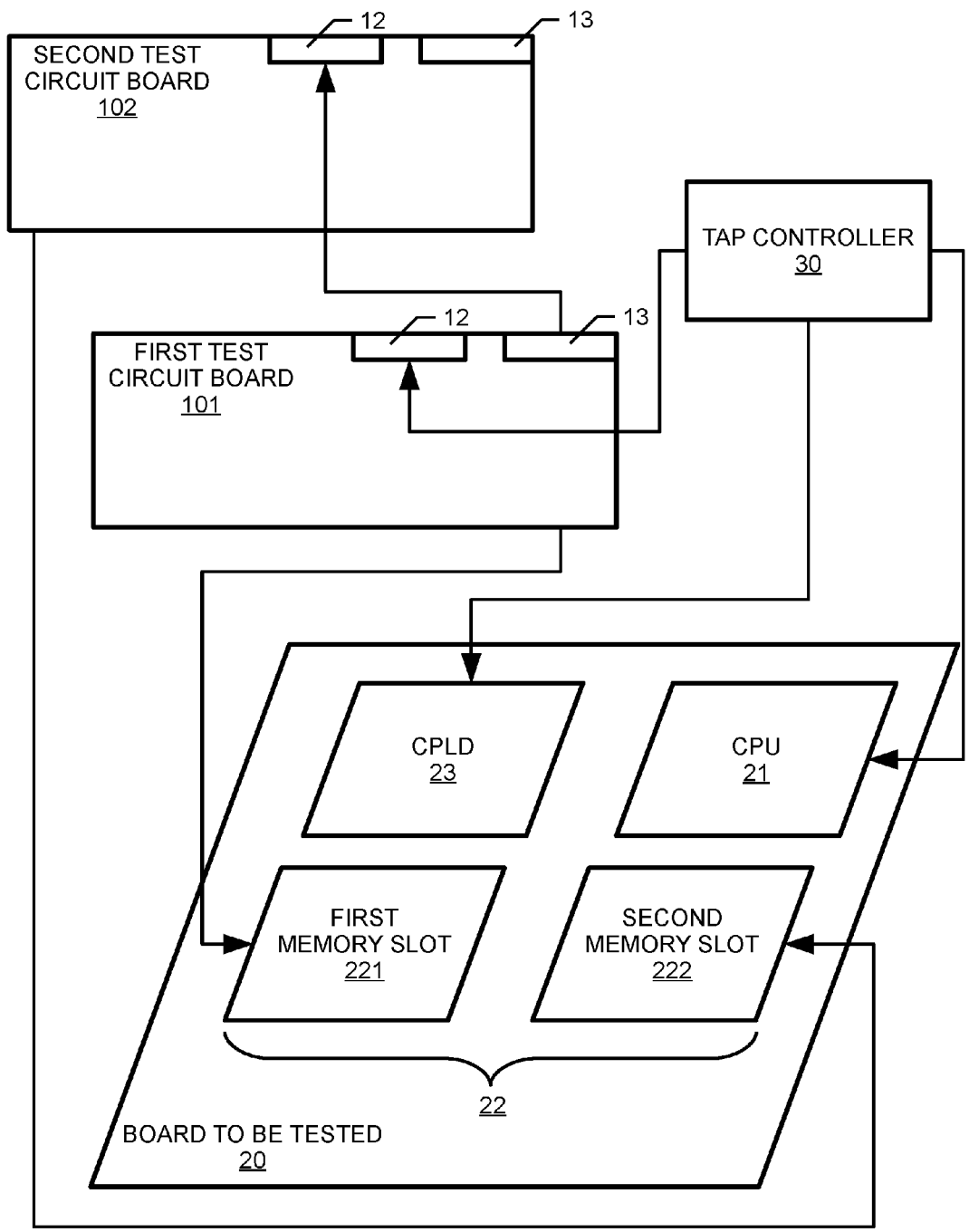
FIG. 2 is a schematic diagram of an architecture of the test circuit board adapted to be used on memory slot in a test process according to the present invention.

In the following, a test circuit board adapted to be used on memory slot disclosed in the present invention will be described with reference to FIG. 1 and FIG. 2. FIG. 1 is a schematic diagram of an architecture of a test circuit board adapted to be used on memory slot according to the present invention. FIG. 2 is a schematic diagram of an architecture of the test circuit board adapted to be used on memory slot in a test process according to the present invention.

The test circuit board 10 further comprises a memory connection interface 11, a first joint test action group (JTAG) connection interface 12, a second JTAG connection interface 13, JTAG signal processing chip 14, at least a JTAG control chip 15, at least an analog-to-digital converter (ADC) chip 16, a switch chip 17 and a voltage conversion chip 18.

A board to be tested 20 further comprises a central processing unit (CPU) 21, a plurality of memory slots 22 and a complex programmable logic device (CPLD) 23.

The memory connection interface 11 of the test circuit board 10 is used to insert the test circuit board 10 onto the memory slot 22 of the board to be tested 20, to form an electrical connection between the test circuit board 10 and the board to be tested 20. Each of the memory slots 22 may be inserted onto one test circuit board 10.

The first JTAG connection interface 12 of the test circuit board 10 is used to connect electrically to a test access port (TAP) controller 30, or the first JTAG connection interface 12 of the test circuit board 10 is used to connect electrically to the second JTAG connection interface 13 of another test circuit board 10, so that the test circuit board 10 may be connected in series with another test circuit board.

Specifically, the board to be tested 20 has a first memory slot 221 and a second memory slot 222. The first test circuit board 101 is inserted onto a first memory slot 221 of the board to be tested 20. The second test circuit board 102 is inserted onto the second memory slot 222. The first JTAG connection interface 12 of the first test circuit board 101 is connected electrically to the TAP controller 30. The second JTAG connection interface 13 of the first test circuit board 101 is connected electrically to the first JTAG connection interface 12 of the second test circuit board 102, so that an in-series connection may be formed between the first test circuit board 101 and the second test circuit board 102. However, this embodiment is merely an example, without limiting the present invention.

The JTAG signal processing chip 14 of test circuit board 10 is connected electrically to the first JTAG connection interface 12 and the second JTAG connection interface 13 of the test board 10. The JTAG signal processing chip 14 of the test circuit board 10 is used to increase a stability of a JTAG signal transmitted by the first JTAG connection interface 12 of the test circuit board 10 and the second JTAG connection interface 13 of the test circuit board 10.

The board to be tested 20 of the CPU 21 is used to detect the test circuit board 10 in a boundary scan. The board to be tested 20 has a complex programmable logic device (CPLD) is used to control a power state of the board to be tested 20.

The TAP controller 30 is connected electrically to the CPU 21 of the board to be tested 20 and the CPLD 23 of the board to be tested 20. Further, the TAP controller 30 is used to control the CPLD 23 of the board to be tested 20, to control a state of a power supply. The test TAP controller 30 is also used to control the CPU 21 of the board to be tested 20 and the CPLD 23 of the board to be tested 20 to work in a boundary scan mode. And, the test TAP controller 30 controls the board to be tested 10 through the first JTAG connection interface 12 to work in a boundary scan mode.

The JTAG control chip 15 of the test circuit board 10 is connected electrically to the JTAG signal processing chip 14. The JTAG control chip 15 of the test circuit board 10 is used to detect a plurality of pins of the memory slot 22 of the board to be tested 20, test a state control of the test circuit board 10 and simulate an Inter Integrated circuit (IIC) bus of the test circuit board 10.

The ADC chip 16 of the test circuit board 10 is connected electrically to the JTAG control chip 15 of the test-board 10. The ADC chip 16 of the test circuit board 10 is used to detect a voltage on the plurality of pins 22 of the memory slot 22.

The switch chip 17 of the test circuit board 10 is connected electrically to the JTAG control chip 15 of the test circuit board 10 and the ADC chip 16 of the test circuit board 10, respectively. The switch chip 17 of the test circuit board 10 is used to detect a particular signal on the memory slot 22 of the board to be tested, so that the particular signal may be applied for a detection on the JTAG control chip 15 or the ADC chip 16.

The voltage conversion chip 18 of the test circuit board 10 is used to acquire a power supply through the memory slot 22 of the test circuit board 10 and convert the power, so that a work voltage may be provided to the JTAG signal processing chip 14, the JTAG control chip 15, the ADC switch chip 16 and the switch chip 17 of the test circuit board 10.

The TAP controller 30 detects the pins of the memory slot 22 of the board to be tested 20, control a state, simulate the IIC bus, detect a voltage of the pins of the memory slot 22 of the board to be tested 20, and detect a particular signal of the pins of the memory slot 22 of the board to be tested 20 at the time when the CPLD 23 of the board to be tested 20, the CPU 21 of the board to be tested 20, and the test circuit board 10 operate in a boundary scan mode, through the JTAG control chip 14 of the test circuit board 10, the ADC chip 15 of the test circuit board 10, and the switch chip 16 of the test circuit board 10.

In summary, the test circuit board of the present invention has the difference as compared to the prior art that the first and second JTAG connection interfaces of the test circuit board may form the in-series connection there between to reduce a required number of TAP ports in the TAP controller, and the test circuit board provides a test signal coverage on all the test signals, facilitate a use of a production line, to further reduce a cost of the test circuit board.

By using the technical means of the present invention, the issues long encountered in the prior art of absence of the test signal overage of the memory slot in the board to be tested may be overcome, and the technical efficacies of a reduced required TAP number in the TAP controller and a test signal coverage on all the test signals may also be achieved.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A test circuit board adapted to be used on memory slot, comprising:
   the test circuit board, further comprising:
      a memory connection interface, forming an electrical connection being inserted into a memory slot;
      a first joint test action group (JTAG) connection interface, connected electrically to a test access port (TAP) controller or connected electrically to a second JTAG connection interface of another test circuit board to form an in-series connection with the another test circuit board;
      a second JTAG connection interface, connected electrically to the first JTAG connection interface of the another test circuit board;
      a JTAG signal processing chip, connected electrically to the first JTAG connection interface and the second JTAG connection interface;
      at least a JTAG control chip, connected electrically to the JTAG processing chip, to detect a signal of a plurality of pins of the memory slot, control a state of the memory slot and simulate an Inter-Integrated Circuit (IIC) of the memory slot;
      at least an analog-to-digital converter (ADC) chip, connected electrically to the JTAG control chip, to be used to detect a voltage of the plurality of pins of the memory slot;
      a switch chip, connected electrically to the JTAG control chip and the ADC chip, to be used to detect a particular signal of the plurality of pins of the memory slot through the JTAG control chip or the ADC chip; and
      a voltage conversion chip, providing a work voltage required by the JTAG signal processing chip, the JTAG control chip, the ADC chip and the switch chip, and acquiring a power supply through the plurality of memory slots; and
   a board to be tested, comprising:
      a central processing unit (CPU), providing a boundary scan mode to detect the test circuit board;
      a plurality of memory slots, providing an insert connection of the test circuit board; and a complex programmable logic device (CPLD), controlling a power state of the board to be tested, wherein the TAP controller is connected electrically to the CPU, the CPLD and the first JTAG connection interface, and wherein the TAP controller is used to detect the plurality of pins of the memory slot, control a state of the memory slot, simulate the IIC of the memory slot, detect the voltage of the plurality of pins of the memory slot, and detect the particular signal of the plurality of pins of the memory slot at the CPU, the CPLD and the test circuit board have the boundary scan mode.

2. The test circuit board adapted to be used on memory slot as claimed in claim 1, wherein the TAP controller is used to control the CPLD to control a power supply state of the board to be tested.

3. The test circuit board adapted to be used on memory slot as claimed in claim 1, wherein the TAP controller is used to control the CPLD and the CPU to have the boundary scan mode.

4. The test circuit board adapted to be used on memory slot as claimed in claim 1, wherein the TAP controller is used to control the test circuit board to have the boundary scan mode.

* * * * *